(12) United States Patent
Cheng et al.

(10) Patent No.: US 10,332,800 B2
(45) Date of Patent: Jun. 25, 2019

(54) VERTICAL FIELD EFFECT TRANSISTOR HAVING U-SHAPED TOP SPACER

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/961,127

(22) Filed: Apr. 24, 2018

(65) Prior Publication Data

US 2019/0122935 A1    Apr. 25, 2019

Related U.S. Application Data

(63) Continuation of application No. 15/788,390, filed on Oct. 19, 2017, now Pat. No. 10,032,676, which is a
(Continued)

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |

(Continued)

(52) U.S. Cl.
CPC ........... *H01L 21/823487* (2013.01); *H01L 21/823418* (2013.01); *H01L 29/0847* (2013.01);
(Continued)

(58) Field of Classification Search
CPC ....... H01L 21/823487; H01L 21/31111; H01L 29/0649; H01L 29/0847
(Continued)

(56) References Cited

U.S. PATENT DOCUMENTS

| 5,914,519 A | 6/1999 | Chou et al. |
| 81,216,909 | 7/2012 | Abadeer et al. |

(Continued)

OTHER PUBLICATIONS

Kawasaki et al., "Challenges and Solutions of FinFET Integration in an SRAM Cell and a Logic Circuit for 22 nm node and beyond", 2009 IEEE International Electron Devices Meeting. Dec. 7-9, 2009, pp. 1-4.

(Continued)

*Primary Examiner* — David S Blum
(74) *Attorney, Agent, or Firm* — Tutunjian & Bitetto, P.C.; Vazken Alexanian

(57) ABSTRACT

A method is presented for forming a semiconductor structure. The method includes forming a plurality of fins over a source/drain region, forming a first spacer within troughs defined by the plurality of fins and depositing a high-k dielectric layer, a work function material layer, and a conducting layer. The method further includes etching the high-k dielectric layer, the work function material layer, and the conducting layer to form recesses between the plurality of fins, depositing a liner dielectric, and etching portions of the liner dielectric to form a plurality of second spacers having a U-shaped configuration. The method further includes forming an epitaxial layer over the plurality of fins such that a gap region is defined between the plurality of second spacers and the epitaxial layer.

20 Claims, 11 Drawing Sheets

Related U.S. Application Data continuation of application No. 15/413,588, filed on Jan. 24, 2017, now Pat. No. 9,859,166.

(51) Int. Cl.

| | | |
|---|---|---|
| *H01L 21/76* | (2006.01) | |
| *H01L 21/8234* | (2006.01) | |
| *H01L 29/78* | (2006.01) | |
| *H01L 29/51* | (2006.01) | |
| *H01L 29/66* | (2006.01) | |
| *H01L 29/10* | (2006.01) | |
| *H01L 29/08* | (2006.01) | |
| *H01L 27/088* | (2006.01) | |

(52) U.S. Cl.
CPC ........ *H01L 29/1037* (2013.01); *H01L 29/517* (2013.01); *H01L 29/66545* (2013.01); *H01L 29/7827* (2013.01); *H01L 29/7851* (2013.01); *H01L 21/823437* (2013.01); *H01L 21/823468* (2013.01); *H01L 27/088* (2013.01)

(58) Field of Classification Search
USPC .......................................... 438/421; 257/329
See application file for complete search history.

(56) References Cited

U.S. PATENT DOCUMENTS

| | | |
|---|---|---|
| 9,006,066 B2 | 4/2015 | Chi et al. |
| 9,029,930 B2 | 5/2015 | Kelly et al. |
| 9,252,233 B2 | 2/2016 | Hsiao et al. |
| 9,299,835 B1 | 3/2016 | Anderson et al. |
| 9,337,306 B2 | 5/2016 | Peng et al. |
| 9,368,572 B1 | 6/2016 | Chang et al. |
| 9,425,280 B2 | 8/2016 | Cai et al. |
| 2012/0276711 A1 | 11/2012 | Yoon et al. |
| 2017/0125299 A1* | 5/2017 | Pranatharthiharan ........................ H01L 29/0847 |
| 2017/0170301 A1* | 6/2017 | Devarajan ......... H01L 29/66545 |
| 2017/0213739 A1* | 7/2017 | Gluschenkov .... H01L 21/28518 |

OTHER PUBLICATIONS

Office Action in related case U.S. Appl. No. 15/413,558 dated Jul. 12, 2017, 15 pgs.

List of IBM Patents or Patent Applications Treated as Related dated Apr. 24, 2018, 2 pages.

\* cited by examiner

VERTICAL FIELD EFFECT TRANSISTOR HAVING U-SHAPED TOP SPACER

BACKGROUND

Technical Field

The present invention relates generally to semiconductor devices, and more specifically, to a vertical field effect transistor (VFET) having a U-shaped top spacer.

Description of the Related Art

A fin metal-oxide-semiconductor field effect transistor (finMOSFET or FinFET) can provide solutions to metal-oxide-semiconductor field effect transistor (MOSFET) scaling issues at and below, for example, the 22 nanometer (nm) node of semiconductor technology. A FinFET includes at least one narrow semiconductor fin (e.g., less than 30 nm wide) gated on at least two opposing sides of each of the at least one semiconductor fin. FinFET structures can, for example, typically be formed on either a semiconductor-on-insulator (SOI) substrate or a bulk semiconductor substrate.

SUMMARY

In accordance with an embodiment, a method is provided for forming a semiconductor structure. The method includes forming a plurality of fins over a source/drain region, forming a first spacer within troughs defined by the plurality of fins and depositing a high-k dielectric layer, a work function material layer, and a conducting layer. The method further includes etching the high-k dielectric layer, the work function material layer, and the conducting layer to form recesses between the plurality of fins, depositing a liner dielectric, and etching portions of the liner dielectric to form a plurality of second spacers having a U-shaped configuration. The method further includes forming an epitaxial layer over the plurality of fins such that a gap region is defined between the plurality of second spacers and the epitaxial layer.

In accordance with an embodiment, a method is provided for forming a semiconductor structure. The method includes forming a plurality of fins over a substrate, forming a spacer adjacent a lower section of the plurality of fins, depositing a liner dielectric, and etching portions of the liner dielectric to form a plurality U-shaped spacers adjacent an upper section of the plurality of fins.

In accordance with another embodiment, a semiconductor device is provided. The semiconductor device includes a plurality of fins formed over a source/drain region, a first spacer formed within troughs defined by the plurality of fins, a high-k dielectric layer, a work function material layer, and a conducting layer deposited over the plurality of fins, where the high-k dielectric layer, the work function material layer, and the conducting layer are etched to form recesses between the plurality of fins, a liner dielectric etched to form a plurality of second spacers having a U-shaped configuration, and an epitaxial layer formed over the plurality of fins such that a gap region is defined between the plurality of second spacers and the epitaxial layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

DETAILED DESCRIPTION

Figure 1:
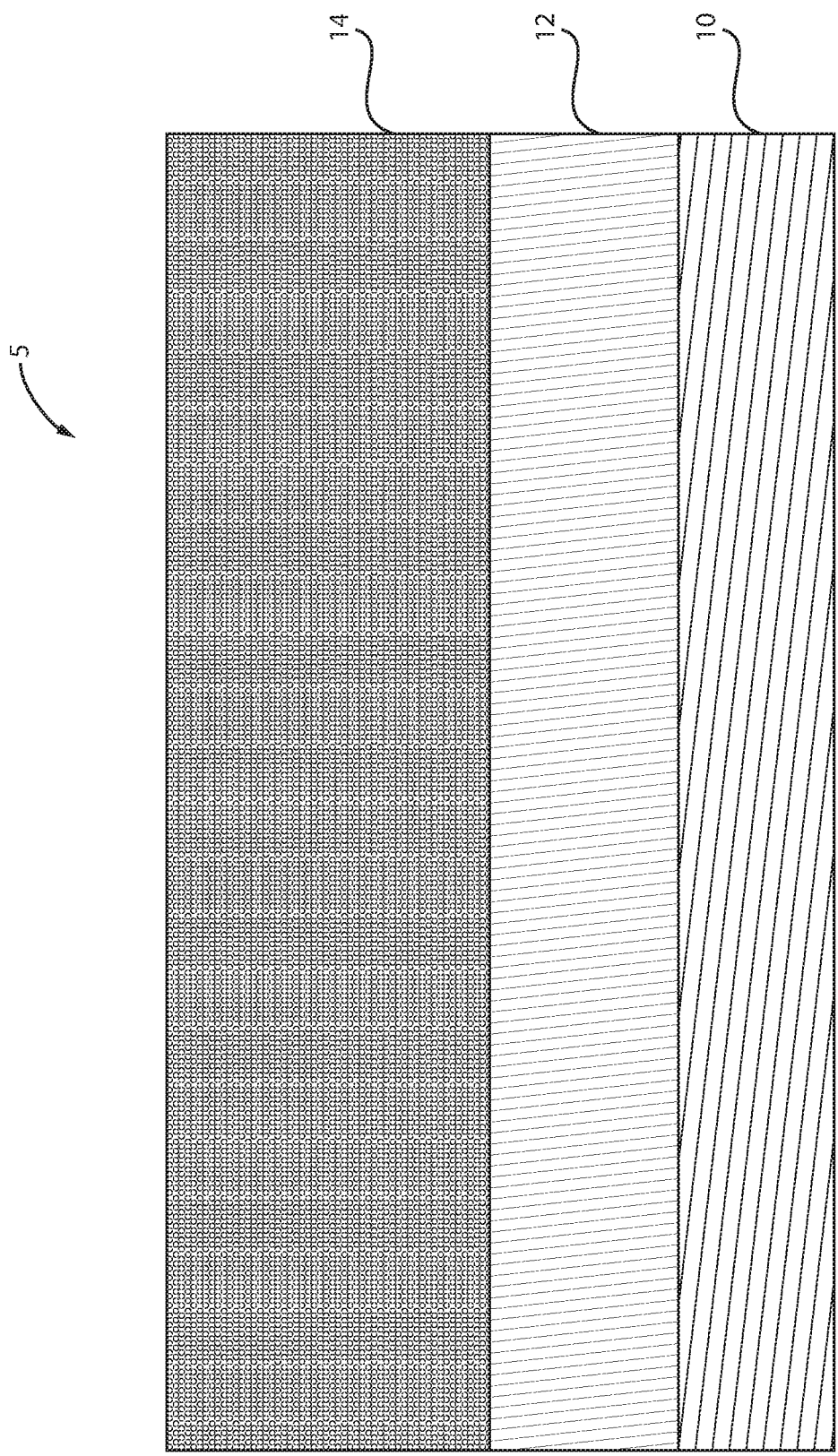
FIG. 1 is a cross-sectional view of a semiconductor structure including an undoped channel region, in accordance with an embodiment of the present invention.

In one or more embodiments, a method includes forming a plurality of fins over a source/drain region, forming a first spacer within troughs defined by the plurality of fins and depositing a high-k dielectric layer, a work function material layer, and a conducting layer. The method further includes etching the high-k dielectric layer, the work function material layer, and the conducting layer to form recesses between the plurality of fins, depositing a liner dielectric, and etching portions of the liner dielectric to form a plurality of second spacers having a U-shaped configuration. The method further includes forming an epitaxial layer over the plurality of fins such that a gap region is defined between the plurality of second spacers and the epitaxial layer.

In one or more embodiments, a method includes forming a plurality of fins over a substrate, forming a spacer adjacent a lower section of the plurality of fins, depositing a liner dielectric, and etching portions of the liner dielectric to form a plurality U-shaped spacers adjacent an upper section of the plurality of fins.

In one or more embodiments, a semiconductor structure includes a plurality of fins formed over a source/drain region, a first spacer formed within troughs defined by the plurality of fins, a high-k dielectric layer, a work function material layer, and a conducting layer deposited over the plurality of fins, where the high-k dielectric layer, the work function material layer, and the conducting layer are etched to form recesses between the plurality of fins, a liner dielectric etched to form a plurality of second spacers having a U-shaped configuration, and an epitaxial layer formed over the plurality of fins such that a gap region is defined between the plurality of second spacers and the epitaxial layer.

In one or more embodiments, a U-shaped top spacer that can naturally form an air gap between the top source/drain epi and the gate is presented, which reduces parasitic capacitance. The goal is to utilize the fact that the top source/drain epi sits on top of the vertical fins. In this case, when forming the top source/drain that is larger than the fin underneath it, an air gap is formed underneath. Therefore, parasitic capacitance between the gate and the top S/D epi for the VFET is reduced by forming top U-shaped spacers that naturally form air gaps between the top S/D epi and the gate.

The work function is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal. The threshold voltage of a MOSFET is usually defined as the gate voltage where an inversion layer forms at the interface between the insulating layer (oxide) and the substrate (body) of the transistor.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of n-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As used herein, an "anisotropic etch process" denotes a material removal process in which the etch rate in the direction normal to the surface to be etched is greater than in the direction parallel to the surface to be etched. The anisotropic etch can include reactive-ion etching (RIE). Other examples of anisotropic etching that can be used include ion beam etching, plasma etching or laser ablation.

As used herein, the term "fin structure" refers to a semiconductor material, which can be employed as the body of a semiconductor device, in which a gate structure is positioned around the fin structure such that charge flows down the channel on the two sidewalls of the fin structure. The fin structures are processed to provide FinFETs. A field effect transistor (FET) is a semiconductor device in which output current, i.e., source-drain current, is controlled by the voltage applied to the gate structure to the channel of a semiconductor device. A finFET is a semiconductor device that positions the channel region of the semiconductor device in a fin structure.

The term "processing" as used herein includes deposition of material or photoresist, patterning, exposure, development, etching, cleaning, stripping, implanting, doping, stressing, layering, and/or removal of the material or photoresist as required in forming a described structure.

Exemplary types of semiconductor devices include planar field effect transistors (FETs), fin-type field effect transistors (FinFETs), nanowire/nanosheet devices, vertical field effect transistors (VFETs), or other devices.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including an undoped channel region, in accordance with an embodiment of the present invention.

A semiconductor structure 5 includes a semiconductor substrate 10. A doped bottom source/drain (S/D) layer 12 is deposited over the substrate 10. An undoped channel region 14 is deposited over the bottom S/D layer 12. The undoped channel region 14 is used to form a plurality of fins, as described below.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

Figure 2:
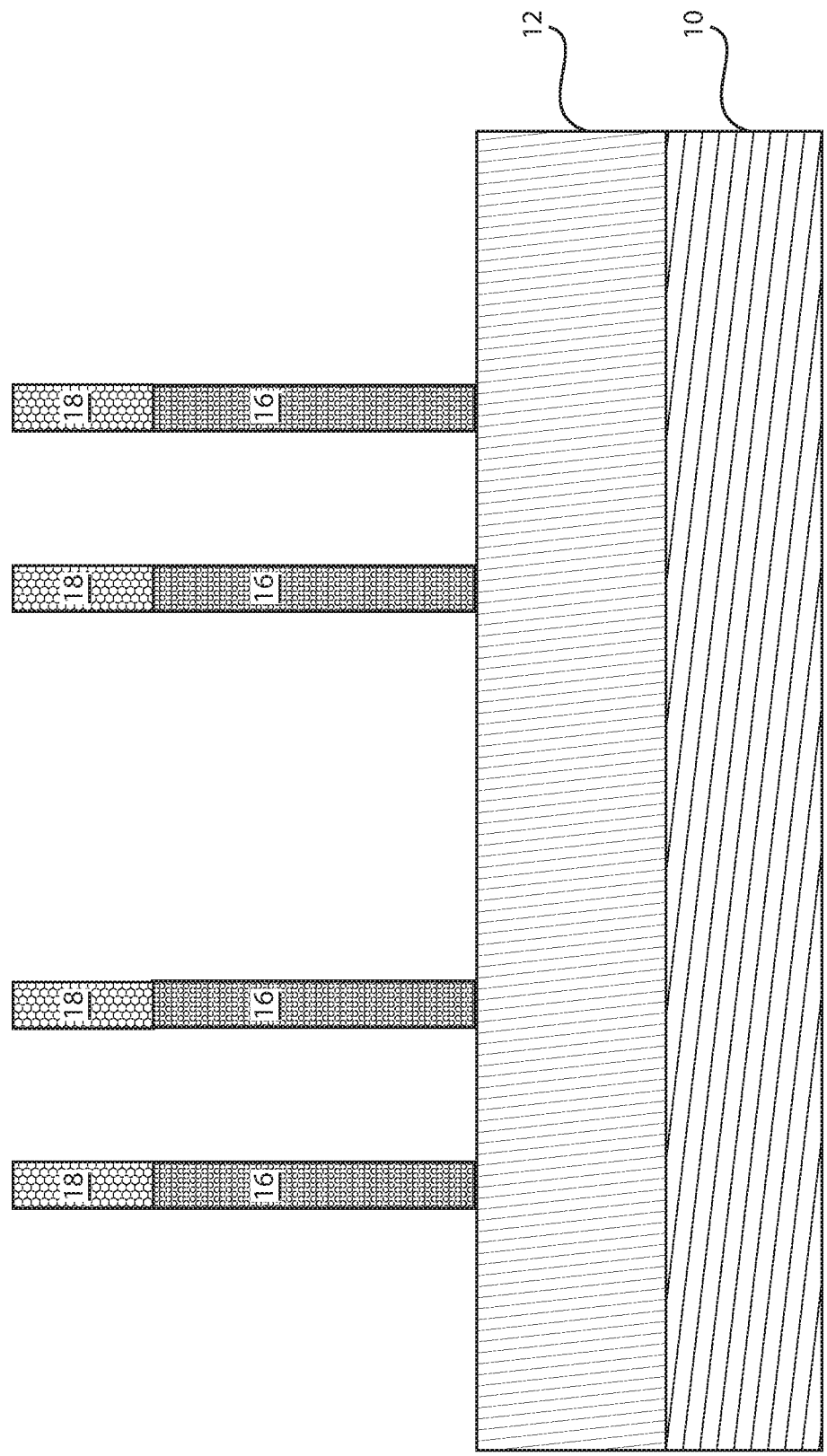
FIG. 2 is a cross-sectional view of the semiconductor structure of FIG. 1 where a plurality of fins are formed from the undoped channel region, in accordance with an embodiment of the present invention.

FIG. 2 is a cross-sectional view of the semiconductor structure of FIG. 1 where a plurality of fins are formed from the undoped channel region, in accordance with an embodiment of the present invention.

In various embodiments, the undoped channel region 14 is etched to form fins 16. A hard mask 18 is also deposited over the fins 16. The hard mask 18 can be, e.g., a silicon nitride (SiN) hard mask 18. A proximal portion of the fin 16 extends up to the doped S/D layer 14. The fin 16 extend vertically from the substrate 10. Stated differently, the fin 16 is normal to or perpendicular to the substrate 10.

As used herein, a "semiconductor fin" refers to a semiconductor structure including a portion having a shape of a rectangular parallelepiped. The direction along which a semiconductor fin 16 laterally extends the most is herein referred to as a "lengthwise direction" of the semiconductor fin 16. The height of each semiconductor fin 16 can be in a range from 5 nm to 300 nm, although lesser and greater heights can also be employed. The width of each semiconductor fin 16 can be in a range from 5 nm to 100 nm, although lesser and greater widths can also be employed. In various embodiments, the fins 16 can have a width in the range of about 6 nm to about 20 nm, or can have a width in the range of about 8 nm to about 15 nm, or in the range of about 10 nm to about 12 nm. In various embodiments, the fin 16 can have a height in the range of about 25 nm to about 75 nm, or in the range of about 40 nm to about 50 nm.

Multiple semiconductor fins 16 can be arranged such that the multiple semiconductor fins 16 have the same lengthwise direction, and are laterally spaced from each other along a horizontal direction that is perpendicular to the lengthwise direction. In this case, the horizontal direction that is perpendicular to the common lengthwise direction is referred to as a "widthwise direction." Each semiconductor fin 16 includes a pair of parallel sidewalls along the lengthwise direction.

In one embodiment, each semiconductor fin 16 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In another embodiment of the present application, each semiconductor fin 16 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 16 has been formed.

In another embodiment, sequential SIT processes can be utilized to form fins with highly scaled fin width and pitches.

In some embodiments, the fins 16 in the plurality of semiconductor fins can have a fin width between 5 nm and 10 nm. The combination of the fin width and the width of the trough equals, in embodiments, the fin pitch. The fin width and the fin pitch can vary in different areas of a fin array, and can vary from one fin array to another on a semiconductor wafer, according to the design parameters of the integrated circuit that is being made. For example, fins of negatively doped FinFETs can have a different fin size than positively doped FinFETs because of the electrical properties of the materials they are made of.

The block masks 18 can comprise soft and/or hard mask materials and can be formed using deposition, photolithography and etching. In one embodiment, the block mask 18 comprises a photoresist. A photoresist block mask can be produced by applying a photoresist layer, exposing the photoresist layer to a pattern of radiation, and then developing the pattern into the photoresist layer utilizing conventional resist developer. Typically, the block masks have a thickness ranging from 10 nm to 300 nm.

The block mask 18 can comprise soft and/or hard mask materials and can be formed using deposition, photolithography and etching. In one embodiment, the block mask 18 is a hard mask composed of a nitride-containing material, such as silicon nitride (SiN). It is noted that it is not intended that the block mask be limited to only silicon nitride, as the composition of the hard mask can include any dielectric material that can be deposited by chemical vapor deposition (CVD) and related methods. Other hard mask compositions for the block mask can include silicon oxides, silicon oxynitrides, silicon carbides, silicon carbonitrides, etc. Spin-on dielectrics can also be utilized as a hard mask material including, but not limited to: silsequioxanes, siloxanes, and boron phosphate silicate glass (BPSG).

In one embodiment, a block mask comprising a hard mask material can be formed by blanket depositing a layer of hard mask material, providing a patterned photoresist atop the layer of hard mask material, and then etching the layer of hard mask material to provide a block mask protecting at least one portion of the dummy gate. A patterned photoresist can be produced by applying a blanket photoresist layer to the surface of the hard mask, exposing the photoresist layer to a pattern of radiation, and then developing the pattern into the photoresist layer utilizing resist developer. Etching of the exposed portion of the block mask can include an etch chemistry for removing the exposed portion of the hard mask material and having a high selectivity to at least the block mask. In one embodiment, the etch process can be an anisotropic etch process, such as reactive ion etch (RIE). In another embodiment, the replacement gate can be formed by utilizing the SIT patterning and etching process described above.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 3:
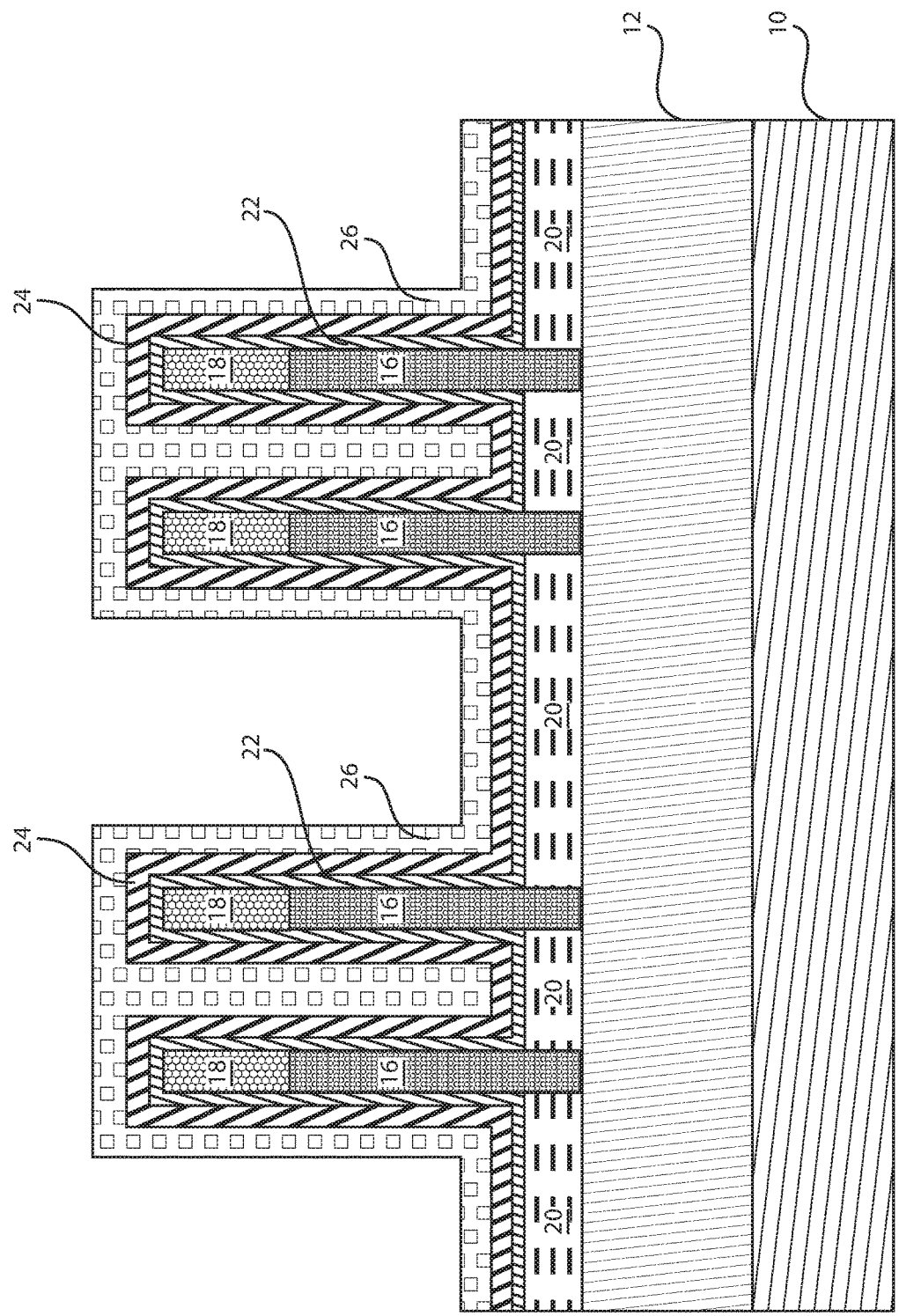
FIG. 3 is a cross-sectional view of the semiconductor structure of FIG. 2 where a high-k layer, a work function material layer, and a conducting layer are deposited over the plurality of fins, in accordance with an embodiment of the present invention.

FIG. 3 is a cross-sectional view of the semiconductor structure of FIG. 2 where a high-k layer, a work function material layer, and a conducting layer are deposited over the plurality of fins, in accordance with an embodiment of the present invention.

In various embodiments, spacers 20 are formed by, e.g., directional deposition or dielectric fill and CMP and etch back/recess. The spacers 20 can be, e.g., a nitride film. In an embodiment, the spacer 20 can be an oxide, for example, silicon oxide (SiO), a nitride, for example, a silicon nitride (SiN), or an oxynitride, for example, silicon oxynitride (SiON). In an embodiment, the spacer 20 can be, e.g., SiOCN, SiBCN, or similar film types. The spacer 20 can also be referred to as a non-conducting dielectric layer.

In some exemplary embodiments, the spacer 20 can include a material that is resistant to some etching processes such as, for example, HF chemical etching or chemical oxide removal etching.

In one or more embodiments, the spacer 20 can have a thickness in the range of about 3 nm to about 10 nm, or in the range of about 3 nm to about 5 nm.

In various embodiments, a high-k dielectric 22 is deposited over the plurality of fins. A work function material layer 24 is then deposited over the high-k dielectric 22. The work function 24 can be, e.g., a work function metal. A conducting layer 26 is then deposited over the work function material layer 24. The conducting layer 26 can be a metal. The metal can be, e.g., Tungsten (W). The layers 22, 24, 26 can form, e.g., a HKMG (high-k metal gate).

In various embodiments, the HKMG can include but is not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the HKMG can have a thickness in the range of about 1.5 nm to about 2.5 nm.

Figure 4:
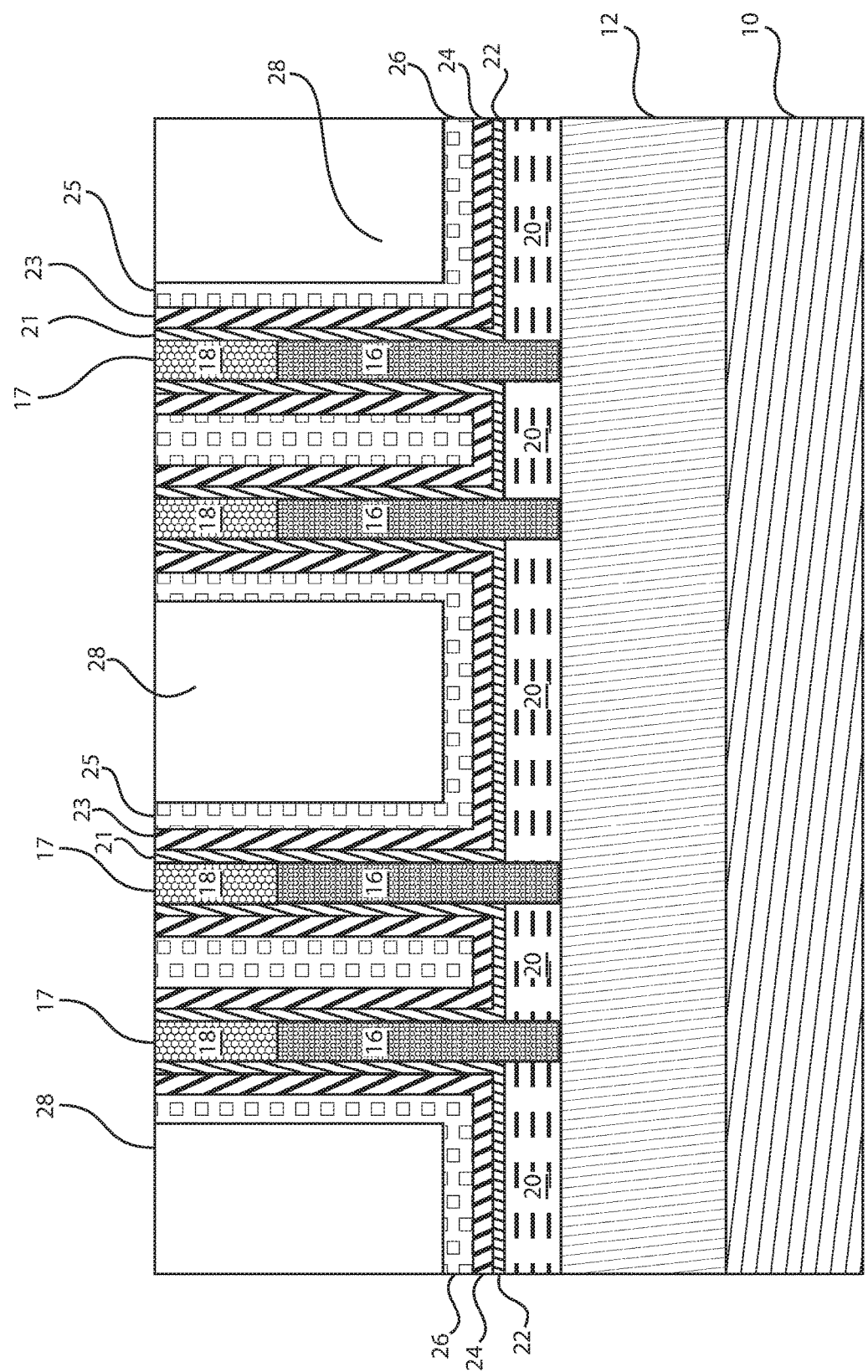
FIG. 4 is a cross-sectional view of the semiconductor structure of FIG. 3 where an ILD oxide fill takes place, in accordance with an embodiment of the present invention.

FIG. 4 is a cross-sectional view of the semiconductor structure of FIG. 3 where an ILD oxide fill takes place, in accordance with an embodiment of the present invention.

In various embodiments, an oxide gap fill takes place. The ILD oxide 28 is planarized. The ILD oxide 28 fills the remaining gap or recess between the fins 16. The top sections or portions of the structure can be etched. As such, high-k dielectric 22, the work function material layer 24, and the conducting layer 26 are selective etched to expose the top surface 17 of the SiN hard mask 18. Thus, the ILD oxide 28 extends beyond a top surface of the fins 16. The ILD oxide 28 extends up to a top surface of the SiN mask 18. In other words, the ILD oxide 28 is flush with the top surface 17 of the SiN hard mask 18. Additionally, the top surface 21 of the high-k dielectric 22 is exposed, the top surface 23 of the work function material layer 24 is exposed, and the top surface 25 of the conducting layer 26 is exposed adjacent the top portion of the SiN hard mask 18.

In various embodiments, the height of the ILD oxide fill 28 can be reduced by chemical-mechanical polishing (CMP) and/or etching. Therefore, the planarization process can be provided by CMP. Other planarization process can include grinding and polishing.

In one or more embodiments, the ILD oxide 28 can have a height of about 20 nm to about 200 nm.

The ILD 28 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the ILD 28 include any of the aforementioned materials in porous form, or in a form that changes during processing to or from being porous and/or permeable to being non-porous and/or non-permeable.

In various embodiments, the top sections formed over the structure are removed by, e.g., CMP. Therefore, the planarization process can be provided by CMP. Other planarization process can include grinding and polishing. In particular, the conducting layer 26, the work function material layer 24 and the high-k dielectric 22 are selectively removed or stripped. The removal of such top section results in the exposure of the top surface 17 of the SiN mask 18.

Figure 5:
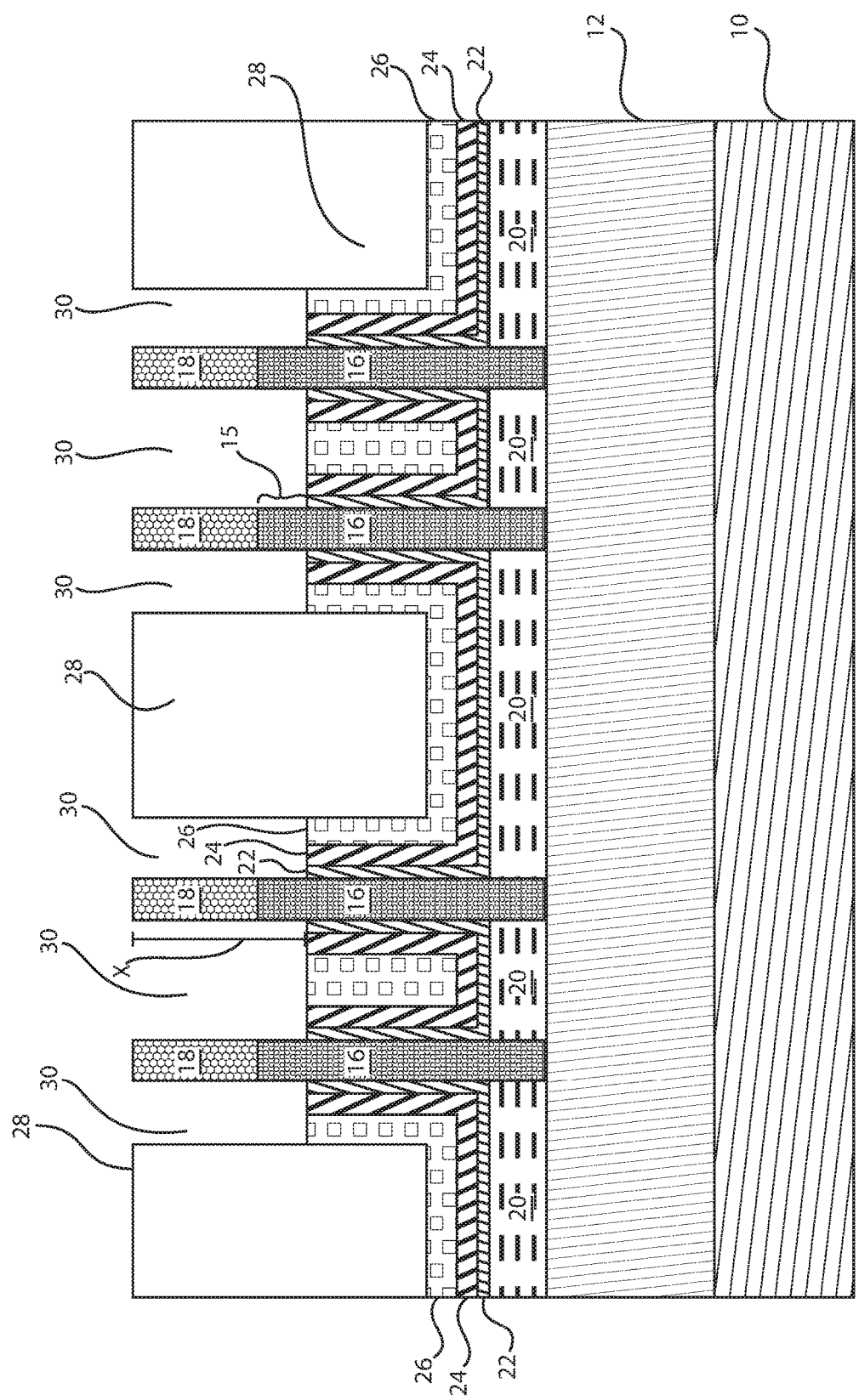
FIG. 5 is a cross-sectional view of the semiconductor device of FIG. 4 where the high-k layer, the work function material layer, and the conducting layer are recessed to expose a top portion of the plurality of fins, in accordance with an embodiment of the present invention.

FIG. 5 is a cross-sectional view of the semiconductor device of FIG. 4 where the high-k layer, the work function material layer, and the conducting layer are recessed to expose a top portion of the plurality of fins, in accordance with an embodiment of the present invention.

In various embodiments, the high-k dielectric 22, the work function material layer 24, and the conducting layer 26 are selective etched to expose the hark mask 18, as well as the top portion 15 of the plurality of fins 16. Thus, gaps or recesses 30 are formed between the SiN hard masks 18 and between the top portions 15 of the plurality of fins 16. The height of the recess 30 is designated by "X." The height of the recess "X" extends from a top surface of the high-k dielectric 22, the work function material layer 24, and the conducting layer 26 to a top surface of the hard mask 18.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 6:
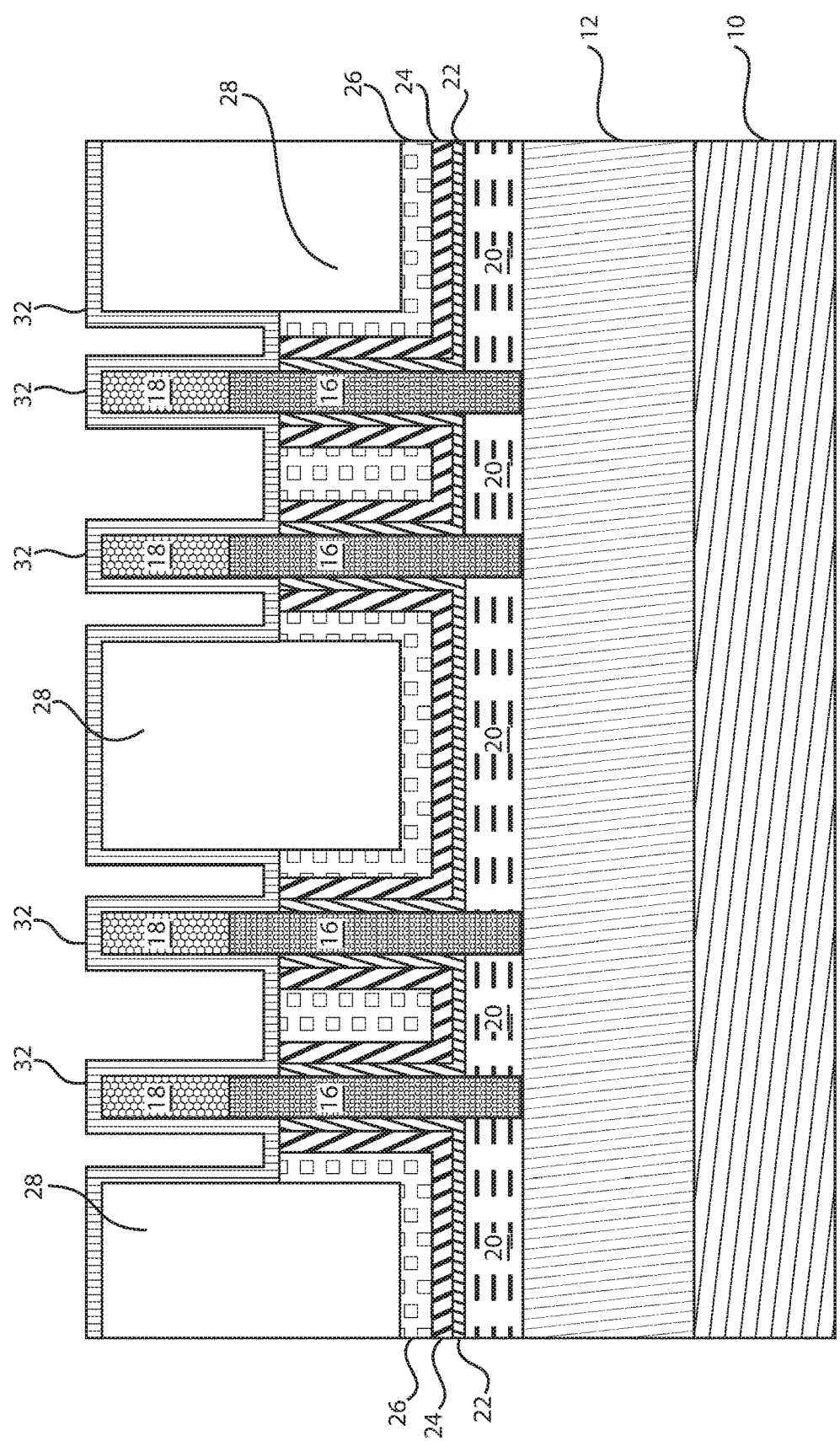
FIG. 6 is a cross-sectional view of the semiconductor device of FIG. 5 where a dielectric liner is deposited over the plurality of fins, as well as over the ILD oxide, in accordance with an embodiment of the present invention.

FIG. 6 is a cross-sectional view of the semiconductor device of FIG. 5 where a dielectric liner is deposited over the plurality of fins, as well as over the ILD oxide, in accordance with an embodiment of the present invention.

In various embodiments, a dielectric liner 32 is deposited over the structure. The dielectric liner 32 can be, e.g., a silicon nitride (SiN) liner. The liner material can also be another dielectric material, such as a low k material (e.g., SiBCN, SiOC, etc.). The SiN liner 32 covers sidewalls of the exposed top portion 15 of the fin 16, as well as sidewalls/top surface of the hard mask 18. The SiN liner 32 also covers the exposed portions/sections of the ILD oxide 28.

Figure 7:
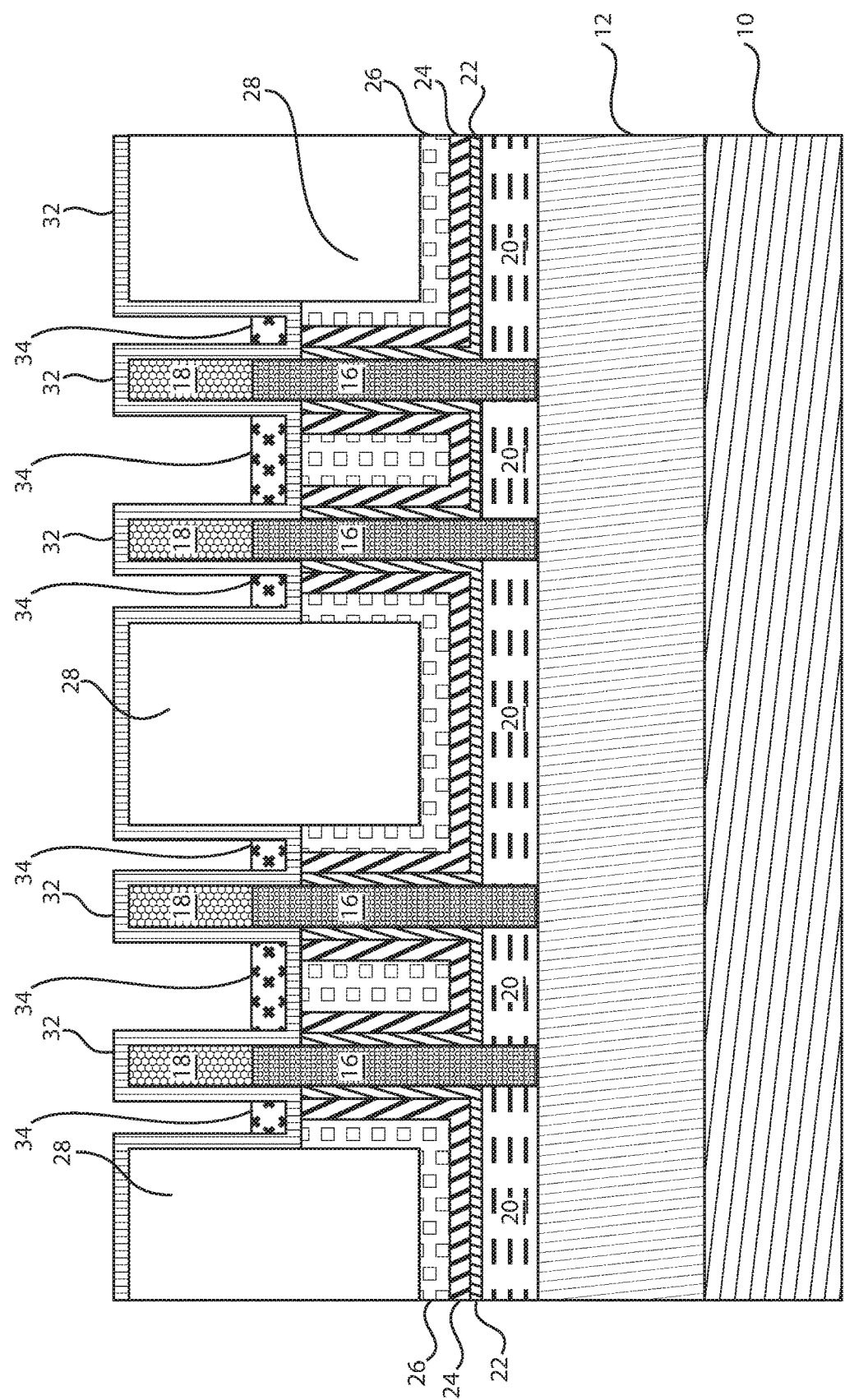
FIG. 7 is a cross-sectional view of the semiconductor device of FIG. 6 where an organic planarization layer (OPL) is deposited within recesses or troughs formed between the plurality of fins, in accordance with an embodiment of the present invention.

FIG. 7 is a cross-sectional view of the semiconductor device of FIG. 6 where an organic planarization layer (OPL) is deposited within recesses or troughs formed between the plurality of fins, in accordance with an embodiment of the present invention.

In one example, an organic planarization layer (OPL) 34 is formed within the U-shaped regions of the SiN liner 32. The OPL 34 can be formed utilizing a deposition process such as, for example, spin-on, CVD, PECVD, evaporation, chemical solution deposition and other like deposition techniques.

The thickness of the OPL 34 can vary so long as its thickness is greater than the total thickness of each gate line and of the plurality of gate lines (not shown). In one embodiment, the OPL 34 has a thickness from 50 nm to 500 nm. In another embodiment, the OPL 34 has a thickness from 150 nm to 300 nm. The OPL 34 can have a thickness greater than the thickness of the SiN layer 32. The thickness of the OPL 34 can be, e.g., approximately equal to the thickness of the top portion 15 of the fin 16.

Figure 8:
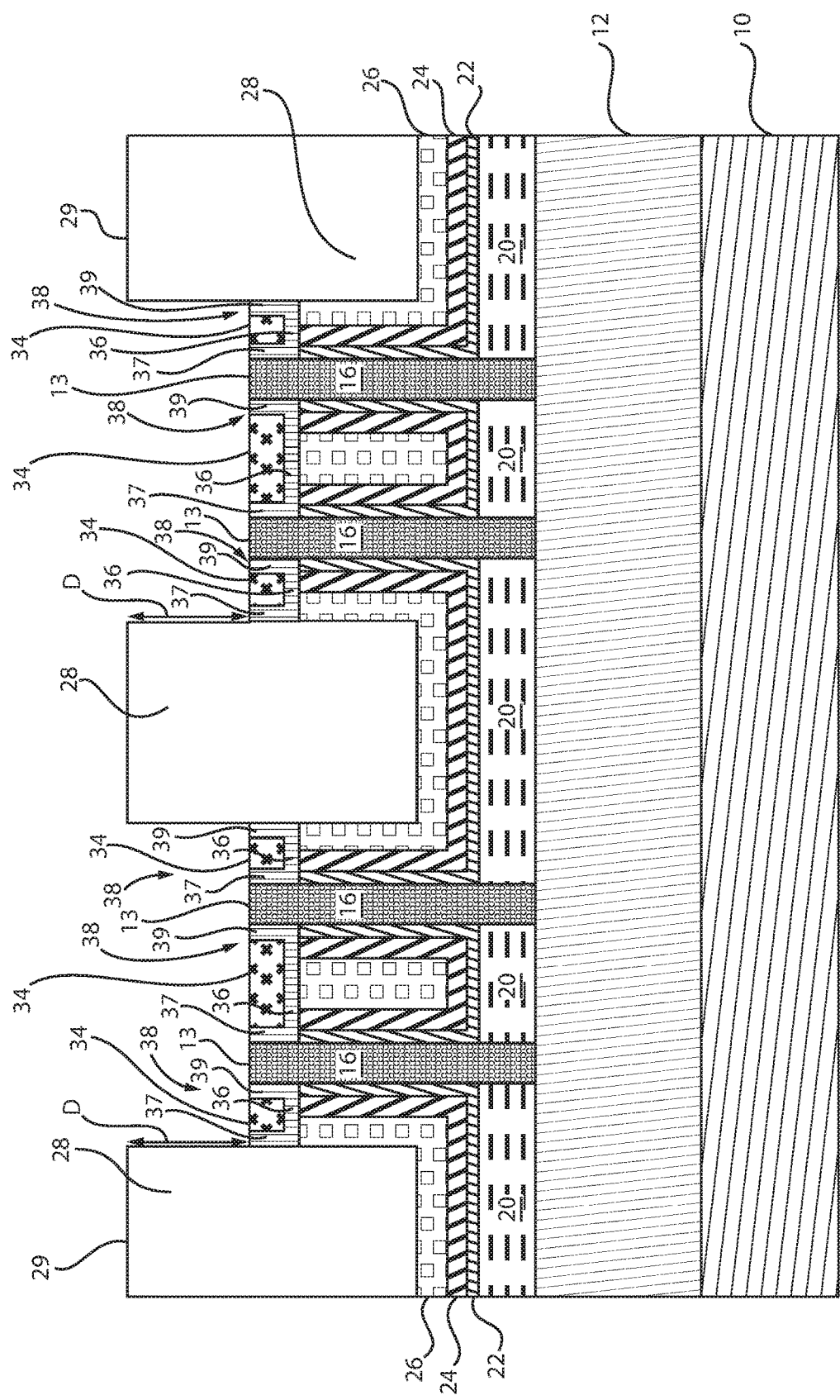
FIG. 8 is a cross-sectional view of the semiconductor device of FIG. 7 where a silicon nitride (SiN) mask positioned over the plurality of fins is etched away to form top spacers, in accordance with an embodiment of the present invention.

FIG. 8 is a cross-sectional view of the semiconductor device of FIG. 7 where a silicon nitride (SiN) mask positioned over the plurality of fins is etched away to form top spacers, in accordance with an embodiment of the present invention.

In various embodiments, etching takes place to remove the hard mask 18, as well portions/sections as the SiN mask 32 contacting or engaging the hard mark 18. The etching creates a recess "D" that extends from a top surface of the OPL 34 to a top surface of the 29 of the ILD oxide 28. The removal of the hard mask 18 allows for the exposure of the top surface 13 of the fin 16. The removal of the hard mask 18 further allows for the exposure of the top surface 29 of the ILD oxide 28. Additionally, the top surface 13 of the fin 16 is flush with the top surface of the OPL 34.

Moreover, U-shaped top spacers 38 are now formed adjacent the top portion of the fin 16. The U-shaped top spacers 38 hold the OPL 34. The U-shaped top spacers 38 are defined by a first section 37, a second section 36, and a third section 39. The first and third sections 37, 39 are parallel to each other, whereas the second section 36 is perpendicular to the first and third sections 37, 39. The first and third sections 37, 39 of the U-shaped top spacer 38 can be parallel to the fin 16. The U-shaped top spacers 38 are offset from the fins 16. Stated differently, the U-shaped top spacers 38 are positioned or formed between the fins 16. The U-shaped top spacers 38 are configured to contact or engage or be adjacent to at least a portion of the fins 16. The U-shaped top spacers 38 selectively contact the HKMG. The U-shaped top spacers 38 are in alignment with their respective HKMG.

Figure 9:
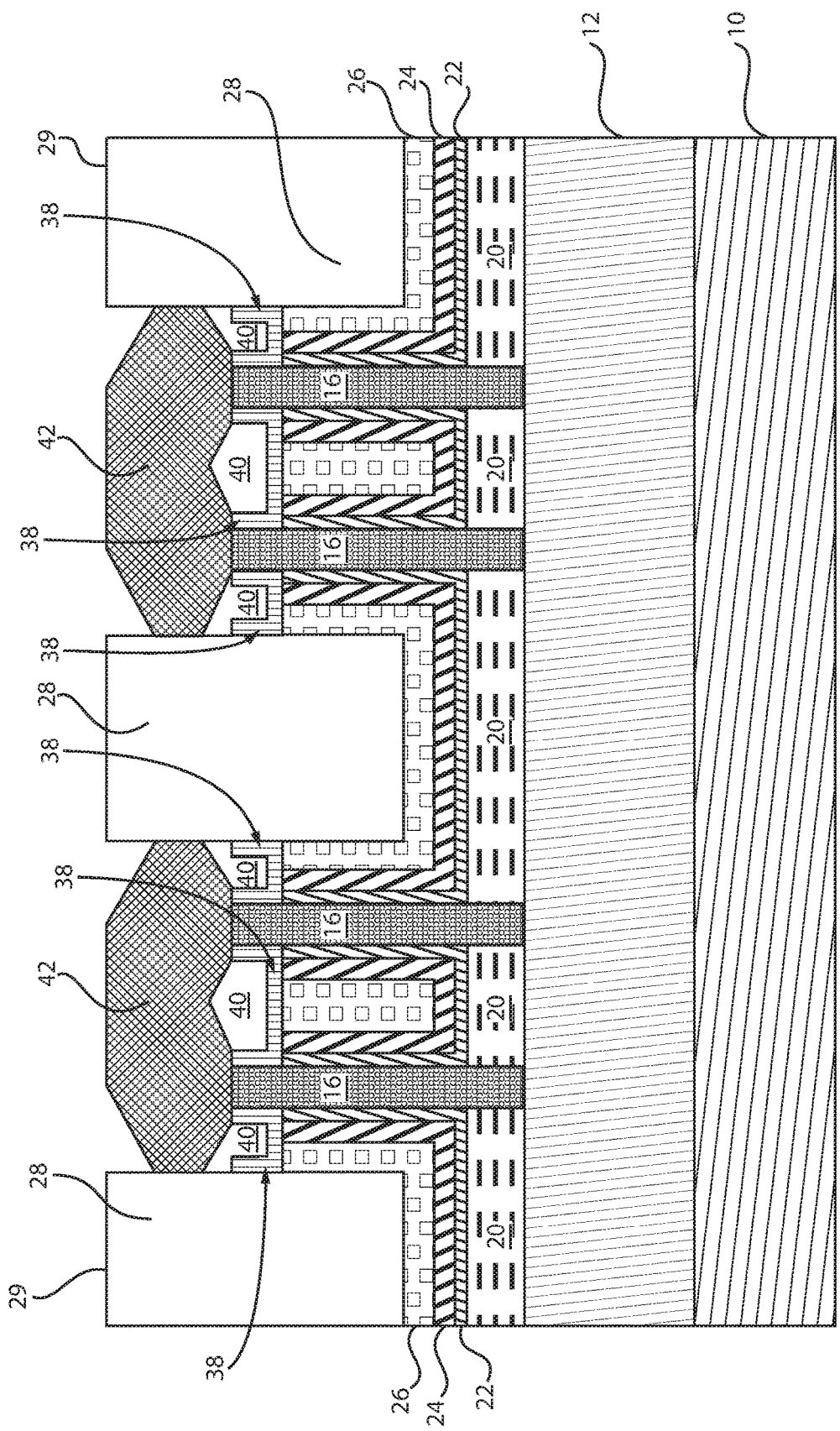
FIG. 9 is a cross-sectional view of the semiconductor device of FIG. 8 where the OPL is removed and an epitaxially growth layer is formed over the plurality of fins such that a gap region is defined between the epitaxially grown layer and the top spacers, in accordance with an embodiment of the present invention.

FIG. 9 is a cross-sectional view of the semiconductor device of FIG. 8 where the OPL is removed and an epitaxially growth layer is formed over the plurality of fins such that a gap region is defined between the epitaxially grown layer and the top spacers, in accordance with an embodiment of the present invention.

In one or more embodiments, a top source/drain 42 is epitaxially grown after the HKMG is defined in the VFET structure. The deposition of the S/D epi 42 results in the creation of voids or gaps 40 between the U-shaped top spacers 38 and the S/D epi 42. The gaps 40 are created in a region where the OPL 34 used to be. Therefore, a U-shaped top spacer 38 can naturally form an air gap 40 between the top source/drain epi 42 and the gate, which reduces parasitic capacitance. The goal is to utilize the fact that the top source/drain epi 42 sits on top of the vertical fins 16. In this case, when forming the top source/drain epi 42 that is larger than the fin 16 underneath it, an air gap 40 is formed underneath. Therefore, parasitic capacitance between the gate and the top S/D epi 42 for the VFET is reduced by forming top U-shaped spacers 38 that naturally form air gaps 40 between the top S/D epi 42 and the gate.

In another embodiment, the HKMG is defined by a replacement metal gate (RMG) process. It is advantageous and useful to form the epitaxial growth layer 42 after formation of the HKMG.

In one or more embodiments, enablement of a higher thermal budget for the top epitaxially grown source/drain regions is advantageously achieved, as well as higher epitaxial growth quality, higher in-situ doping, and lower resistance. In another embodiment, multi-Vt is advantageously enabled through a poly open process.

In one or more embodiments, a VFET process is defined which advantageously enables the top source/drain epitaxial region 42 to be formed with a high thermal budget, to minimize defects stemming from epitaxial growth, and to minimize sheet resistance. In one or more embodiments, a VFET replacement metal gate (RMG) process is defined that is compatible with tight fin pitches to advantageously enable multi-Vt processing.

In various embodiments, the in-situ doped source/drain 42 is advantageously deposited or formed via epitaxial growth. Depending on how the epitaxial growth develops, it can be necessary to anisotropically etch the epitaxial growth, in order to result in a top surface of the source/drain region 42 that is suitable for subsequent processing.

The doped region 42 can be formed above the vertical fin 16. The dopant can be provided to the doped region(s) 42 (i.e., source/drain region(s)) by ion implantation, and source/drains formed by annealing the doped region(s) 42. In various embodiments, the doped region 42 can be n-doped or p-doped. It should be noted that the source and drain can be interchangeable between the top and bottom locations of a vertical fin, where the doped region in the substrate can act as a source or a drain.

In various embodiments, the bottom source can be doped in-situ or ex-situ, for example, through ion implantation or thermal diffusion of dopants into the substrate. The dopant of the source can be activated by annealing. Other suitable doping techniques can also be used, including but not limited to, gas phase doping, plasma doping, plasma immersion ion implantation, cluster doping, infusion doping, liquid phase doping, solid phase doping, or combinations thereof.

Forming the source and drain regions 42 can include forming an in situ doped epitaxial semiconductor material on the source and drain region portions of the fin structures 16. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 42 can be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources can be used for the epitaxial deposition of the epitaxial semiconductor material that provides the source and drain regions 42.

Examples of silicon including source gasses can include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof.

Examples of germanium including source gasses for epitaxially forming the epitaxial semiconductor material of a germanium containing semiconductor include germane, digermane, halogermane, dichlorogermane, trichlorogermane, tetrachlorogermane and combinations thereof.

Epitaxial deposition can be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition can result in crystal defects and film cracking.

The epitaxial semiconductor material that provides the source and drain regions 42 can be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material can introduce p-type dopants to the material being formed during the epitaxial deposition process that includes p-type source gasses.

As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium.

The p-type gas dopant source can include diborane ($B_2H_6$). In some embodiments, the epitaxial deposition process for forming the epitaxial semiconductor material for the source and drain regions 32 can continue until the epitaxial semiconductor material that is formed on adjacent fin structures contact one another to form merged epitaxial semiconductor material.

As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

Figure 10:
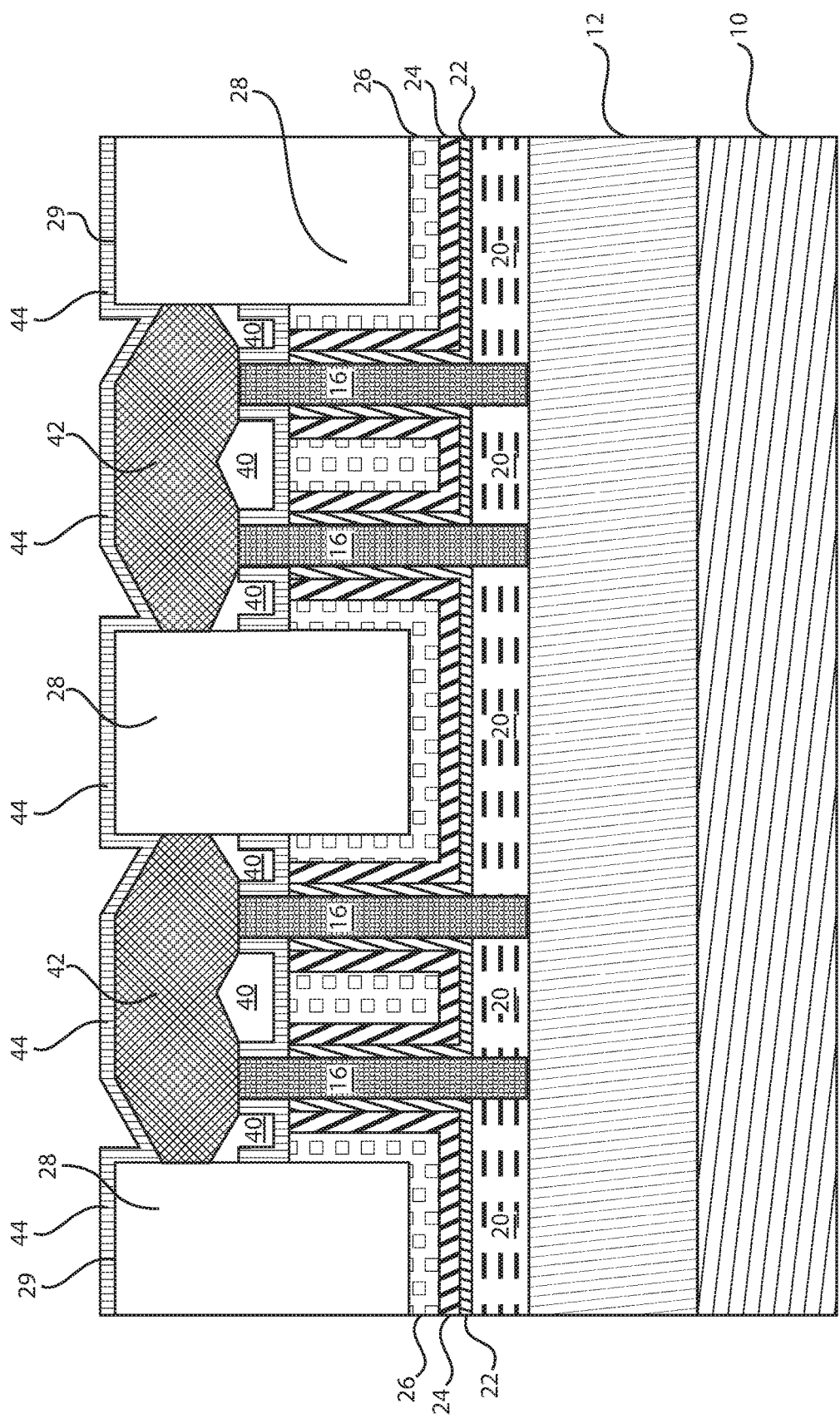
FIG. 10 is a cross-sectional view of the semiconductor device of FIG. 9 where a SiN cap is deposited over the epitaxially grown layer, in accordance with an embodiment of the present invention.

FIG. 10 is a cross-sectional view of the semiconductor device of FIG. 9 where a SiN cap is deposited over the epitaxially grown layer, in accordance with an embodiment of the present invention.

In various embodiments, a SiN cap 44 is deposited over the epitaxially grown layer 42, as well as the exposed portions of the ILD oxide 28.

Figure 11:
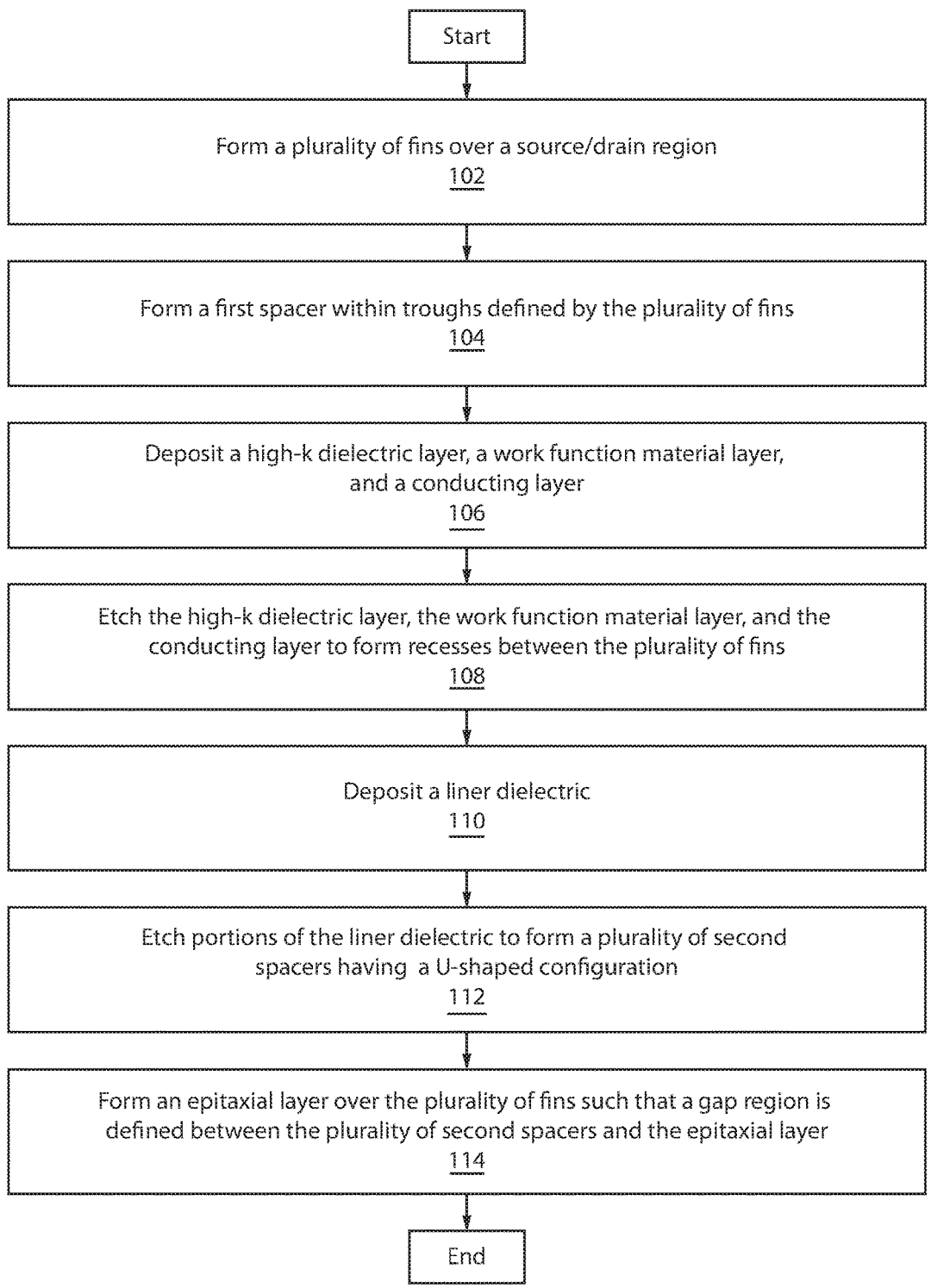
FIG. 11 is a block/flow diagram of an exemplary method for forming U-shaped top spacers adjacent top portions of a plurality of fins, in accordance with an embodiment of the present invention.

FIG. 11 is a block/flow diagram of an exemplary method for forming U-shaped top spacers adjacent top portions of a plurality of fins, in accordance with an embodiment of the present invention.

At block 102, a plurality of fins are formed over a source/drain region.

At block 104, a first spacer is formed within troughs defined by the plurality of fins.

At block 106, a high-k dielectric layer, a work function material layer, and a conducting layer are deposited.

At block 108, the high-k dielectric layer, the work function material layer, and the conducting layer are etched to form recesses between the plurality of fins.

At block 110, a liner dielectric is deposited.

At block 112, portions of the liner dielectric are etched to form a plurality of second spacers having a U-shaped configuration.

At block 114, an epitaxial layer is formed over the plurality of fins such that a gap region is defined between the plurality of second spacers and the epitaxial layer.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including,"

when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated to form U-shaped top spacers adjacent top portions of a plurality of fins (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor structure for reducing parasitic capacitance, the method comprising:
    forming recesses between a plurality of fins;
    depositing a barrier layer within the recesses; and
    etching the barrier layer to define substantially U-shaped spacers adjacent top portions of the plurality of fins.
2. The method of claim 1, further comprising forming a high-k metal gate (HKMG) over the plurality of fins before depositing the barrier layer.
3. The method of claim 2, further comprising etching the HKMG to form the recesses between the plurality of fins.
4. The method of claim 3, further comprising forming an epitaxial layer over the plurality of fins.
5. The method of claim 4, further comprising depositing a nitride cap over the epitaxial layer.
6. The method of claim 5, wherein air gaps are defined between the U-shaped spacers and the epitaxial layer.
7. The method of claim 6, wherein an upper surface of the U-shaped spacers contacts the epitaxial layer.
8. The method of claim 6, wherein the U-shaped spacers contact at least one portion of their corresponding HKMG.
9. The method of claim 6, wherein the U-shaped spacers are in alignment with at least one portion of their corresponding HKMG.
10. The method of claim 6, wherein the U-shaped spacers have different sizes across the semiconductor structure.
11. A semiconductor structure for reducing parasitic capacitance, the semiconductor structure comprising:
    a plurality of fins including recesses therebetween;
    a barrier layer disposed within the recesses; and
    U-shaped spacers defined adjacent top portions of the plurality of fins by etching the barrier layer.
12. The structure of claim 11, wherein a high-k metal gate (HKMG) is disposed over the plurality of fins.
13. The structure of claim 12, wherein the HKMG is etched to form the recesses between the plurality of fins.
14. The structure of claim 13, wherein an epitaxial layer is disposed over the plurality of fins.
15. The structure of claim 14, wherein a nitride cap is disposed over the epitaxial layer.
16. The structure of claim 15, wherein air gaps are defined between the U-shaped spacers and the epitaxial layer.
17. The structure of claim 16, wherein an upper surface of the U-shaped spacers contacts the epitaxial layer.
18. The structure of claim 16, wherein the U-shaped spacers contact at least one portion of their corresponding HKMG.
19. The structure of claim 16, wherein the U-shaped spacers are in alignment with at least one portion of their corresponding HKMG.
20. The structure of claim 16, wherein the U-shaped spacers have different sizes across the semiconductor structure.

* * * * *